United States Patent [19]
Palnitkar et al.

[11] Patent Number: 5,696,942
[45] Date of Patent: Dec. 9, 1997

[54] CYCLE-BASED EVENT-DRIVEN SIMULATOR FOR HARDWARE DESIGNS

[75] Inventors: Samir S. Palnitkar; Darrell R. Parham, both of Sunnyvale, Calif.

[73] Assignee: Sun Microsystems, Inc., Mountain View, Calif.

[21] Appl. No.: 410,319

[22] Filed: Mar. 24, 1995

[51] Int. Cl.[6] .................................. G06F 3/00; G06G 7/48
[52] U.S. Cl. ........................ 395/500; 364/578; 364/488
[58] Field of Search ...................... 395/500, 183.09, 395/375, 550, 189.05, 700, 183.21, 183.04, 183.06, 185.02, 161, 280, 682, 311, 551, 704, 733; 364/578, 481, 490, 488, 489, 491, 190, 191, 132, 221.2, 232.3; 371/22.3, 25.1, 27, 43, 24, 20.1, 57.2; 340/523

[56] References Cited

U.S. PATENT DOCUMENTS

| | | | |
|---|---|---|---|
| 4,527,249 | 7/1985 | Van Brunt | 364/578 |
| 4,872,125 | 10/1989 | Catlin | 364/578 |
| 5,018,089 | 5/1991 | Kanazawa | 364/488 |
| 5,081,601 | 1/1992 | Eirikasson | 364/578 |
| 5,157,620 | 10/1992 | Shaar | 395/500 |
| 5,313,614 | 5/1994 | Goettlmann et al. | 395/500 |
| 5,371,878 | 12/1994 | Coker | 395/800 |
| 5,418,735 | 5/1995 | Saitoh | 364/578 |
| 5,426,768 | 6/1995 | Kanazawa | 395/500 |
| 5,513,339 | 4/1996 | Agrawal et al. | 395/500 |
| 5,539,680 | 7/1996 | Palnitkar et al. | 364/578 |
| 5,550,760 | 8/1996 | Razdan et al. | 364/578 |

FOREIGN PATENT DOCUMENTS

| | | |
|---|---|---|
| 0 418 980 A2 | 3/1991 | European Pat. Off. |
| 0 614 152 A2 | 9/1994 | European Pat. Off. |
| 2 219419 A | 12/1989 | United Kingdom |

OTHER PUBLICATIONS

"Parallel-and-Vector Implementation of the Event-Driven Logic Simulation Algorithm on the Cray Y-MP Supercomputer", Bataineh et al., IEEE Computer Society Technical Committee on Supercomputing Applications, Nov. 1992, pp. 444-452.

"The Inversion Algorithm for Digital Simulation", Maurer, IEEE/ACM International Conference on Computer-Aided Design, Nov. 1994, pp. 258-261.

"Cycle Simulation Techniques", Palnitkar et al., IEEE International Verilog HDL Conference, Mar. 1995, pp. 2-8.

*Primary Examiner*—Jacques Louis-Jacques
*Attorney, Agent, or Firm*—Blakely Sokoloff Taylor & Zafman

[57] ABSTRACT

A method and apparatus for simulation of a hardware design using a cycle-based event-driven simulation. The present invention also provides for a measuring technique for estimating the potential performance gain obtained by using traditional simulation techniques as opposed to the cycle-based event-driven simulation technique of the present invention. The result of the measuring technique is provided for a user as a tool in determining which technique they would like to use for the simulation of their hardware design.

12 Claims, 8 Drawing Sheets

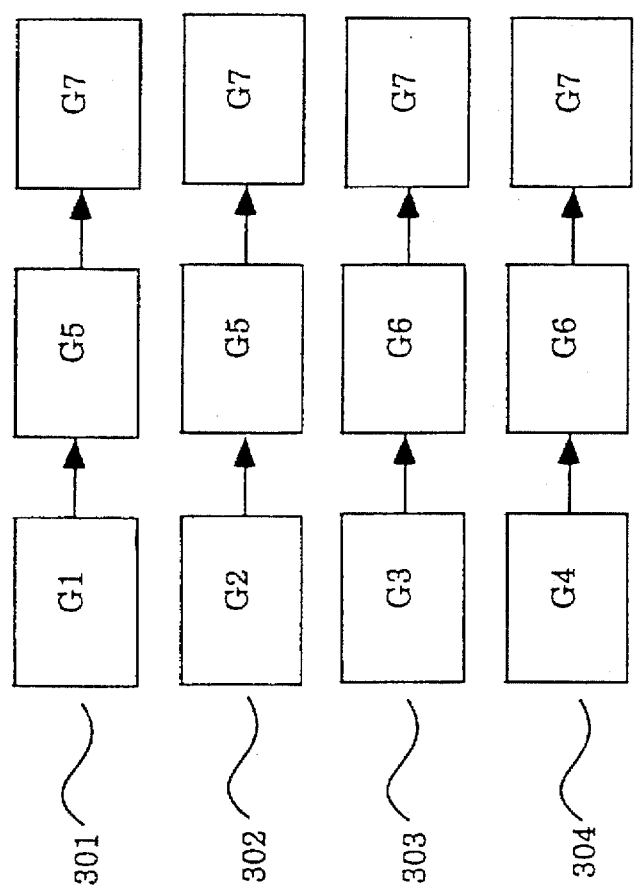
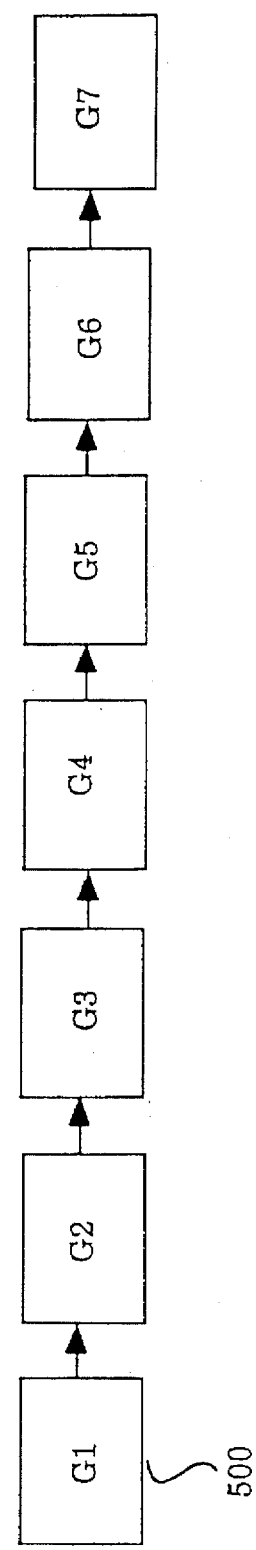

| Routine# | cycle 1 | cycle 2 | cycle 3 | Avg. routine evals all cycles |
|---|---|---|---|---|
| 1 | 2 times | 0 times | 1 times | -- |
| 2 | 3 times | 0 times | 1 times | -- |
| 3 | 0 times | 3 times | 2 times | -- |
| 4 | 1 times | 3 times | 2 times | -- |
| total # of evals in the cycle | 6 routine evals | 6 routine evals | 6 routine evals | 6 routine evals |

| # times exec | cycle 1 | cycle 2 | cycle 3 | Avg. all cycles |
|---|---|---|---|---|
| 0 | 1 routine | 2 routines | 0 routines | 1 routines |
| 1 | 1 routine | 0 routines | 2 routines | 1 routines |
| 2 | 1 routine | 0 routines | 2 routines | 1 routines |
| 3 | 1 routine | 2 routines | 0 routines | 1 routines |

CYCLE-BASED EVENT-DRIVEN SIMULATOR FOR HARDWARE DESIGNS

BACKGROUND OF THE INVENTION

(1) Field of the Invention

The method and apparatus of the present invention relates to the field of hardware simulation for use, for example, dung hardware design, more specifically, implementation of a cycle-based event-driven simulator.

(2) Prior Art

Hardware design is increasingly being peformed using a high level of abstraction, such as may be provided by using a hardware description language. Simulation of hardware design has become an extremely important part of the entire hardware design cycle. Time spent in hardware simulation constitutes a high percentage of the time required for each design iteration. The faster the simulation speeds, the quicker the turnaround time for producing a functional verification of a hardware design.

There are two main types of simulation techniques. One is an event-driven simulation technique where testing is triggered by specific events occurring during a simulated operation of the hardware design being tested. Examples of triggering events include a change in inputs to a sub-section of the simulated hardware design. The other technique is an oblivious simulation technique, where the entire hardware design is evaluated regardless of the occurrence of "triggering events". An advantage of an oblivious simulation technique over an event-driven simulation technique is that an oblivious simulation technique may have a cycle-based implementation. With a cycle-based implementation, evaluation or testing is only peformed on clock edges instead of on every unit of clock time. Cadence Verilog XL® and Chronologic VCS® are examples of event-driven simulators. IBM Maxsim® is an example of an oblivious simulator. The details of the two main types of simulation techniques are described in more detail below.

An oblivious simulation technique is well understood in the art (see Wang, L., Hoover, N. E., Porter, E. H., Zasio, J. J., "SSIM: A software levelized compiled-code simulator", *Proc. Design Automation Conference*, pp. 2–7, 1987.) Given a synchronous design, a logic levelization is applied to the design. Logic levelization is a process of emulating the data flow from primary inputs into the design and clocked element outputs into both primary outputs and clocked element inputs. The levelization technique cannot be applied where there are feedback loops. After a levelization is applied to a design, each stage of the design appears as an array of clocked elements with combinational logic in between.

FIG. 1 illustrates an exemplary data flow in a levelized design 100 produced by the oblivious simulation technique. In an oblivious simulation, the entire design is evaluated once every time unit whether or not the inputs to a sub-section of a hardware design change. Cycle-based implementation has been used in conjunction with the oblivious simulation technique (hereinafter referred to as a cycle-based oblivious simulation technique). For example, IBM's Maxsim® performs a cycle-based oblivious simulation. However, cycle-based implementation has not been utilized in combination with an event-driven simulation technique.

Traditional event-driven simulators including Verilog XL® do not evaluate events at clock edges as occurs with a cycle-based oblivious simulation technique. Instead, event-driven simulators look at time as each unit of clock time, for example, 1, 2, 3, etc. (hereinafter referred to as the system clock cycle). With a simulation technique with a cycle-based implementation, clock cycle starts at zero (0) and continues counting every clock cycle. Thus, if the clock cycle is defined as being 20, then the sequence of clock cycles would be 0, 20, 40, 60, etc. (hereinafter referred to as the evaluation clock cycle). This has an advantage of a tremendous performance boost, because unlike simulators without the cycle-based implementation, evaluation is only performed during the clock cycles and not at each unit of clock time.

It would be desirable to have a method and an apparatus allowing for evaluations of a simulated hardware design to be performed at active clock edges instead of at each unit of time and only when certain events occur such as a change in input to the simulated hardware design. This is in contrast to the prior art simulation techniques such as the oblivious simulation technique where the entire design is evaluated regardless of changes in events and the event-driven simulation technique which evaluates events at every time unit. Both prior art simulation techniques may lead to time consuming and inefficient evaluations of a given hardware design. In addition, it would be desirable to be able to have a measurement technique which evaluates the performance gain obtained by applying a more efficient simulation technique to a given hardware design.

BRIEF SUMMARY OF THE INVENTION

A method and an apparatus for simulation of a hardware design using a cycle-based event-driven simulation is disclosed. Typically, various events occur in a simulated hardware design, including inputs being made to a sub-section of the simulated hardware design. Using the cycle-based event-driven simulation of the present invention, events occurring between two evaluation edges of a clock cycle are stored in an event queue up until the end of a given cycle. Once at the end of a clock cycle, an event scheduler schedules the events in their appropriate order of evaluation. Each event is then fetched from the event queue and a connectivity finder looks for the dependencies and determines the connectivity between the events. Once the dependencies and the connectivity between the events are determined, a reorderer reorders the events into an event list. Each event is then evaluated in the order that they are linked in the event list. Any new events occurring as a consequence of an evaluation of an event in the event list are stored in the event queue as they are generated. The process is repeated for every clock cycle with the event queue being reset to empty.

The use of a traditional event-driven simulation technique without a cycle based implementation may lead to multiple unnecessary evaluations of sub-sections of a given hardware design. Unlike this traditional event-driven simulation technique, the cycle-based event-driven simulation technique of the present invention provides for the evaluation of a given hardware design only at each evaluation clock cycle and only when triggering events occur. In addition, the cycle-based event-driven simulation technique of the present invention is far more efficient than an oblivious simulation technique since unlike the oblivious simulation technique, the present invention only evaluates the hardware design when triggering events occur. In contrast the oblivious simulation technique evaluates the entire design regardless of the occurrence of "triggering events."

The present invention also provides for a measuring technique for estimating the potential performance gain obtained by using traditional simulation techniques as opposed to the cycle-based event-driven simulation technique of the present invention. The result of the measuring technique is provided for a user as a tool in determining which technique they would like to use for the simulation and evaluation of their hardware design.

BRIEF DESCRIPTION OF THE DRAWINGS

FIG. 5b illustrates the order of events triggered by events 301 through 304.

FIG. 5c illustrates a reordered list of events.

FIG. 8 is a table illustrating the routines executed for an exemplary module A where module A is run for three clock cycles.

FIG. 9 is a table illustrating the number of routines that are executed and the number of times they were executed for each cycle for the exemplary module A.

DETAILED DESCRIPTION OF THE INVENTION

The present invention is a method and an apparatus for simulation of a hardware design using a cycle-based event-driven simulation. The present invention also provides for a measuring technique for estimating the potential performance gain obtained by using the cycle-based event-driven simulation technique of the present invention. The result of the measuring technique is provided for a user as a tool in determining which technique they would like to use for the simulation of their hardware design.

Figure 1:
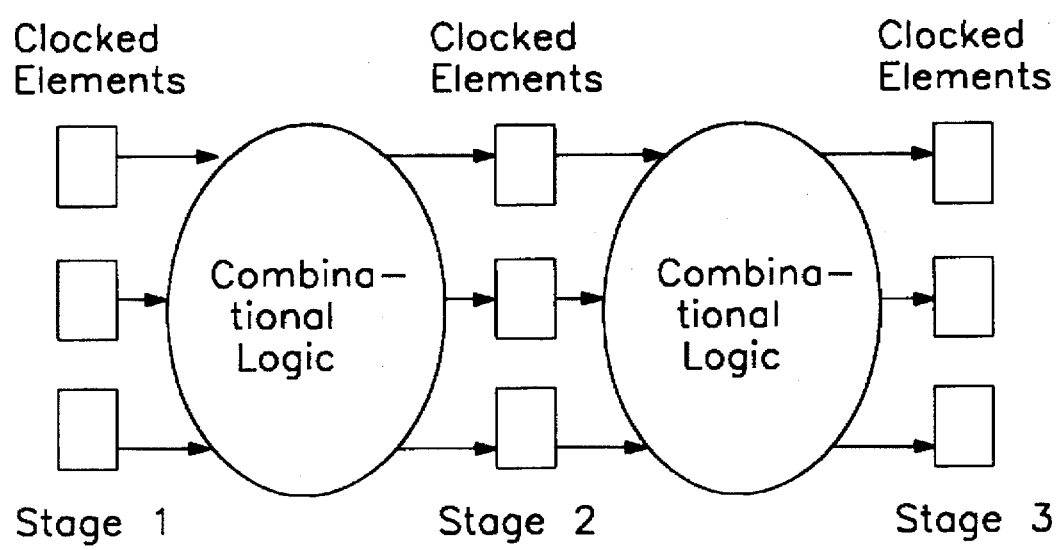
FIG. 1 illustrates an exemplary data flow in a levelized design produced by using a traditional simulation technique.
Figure 2:
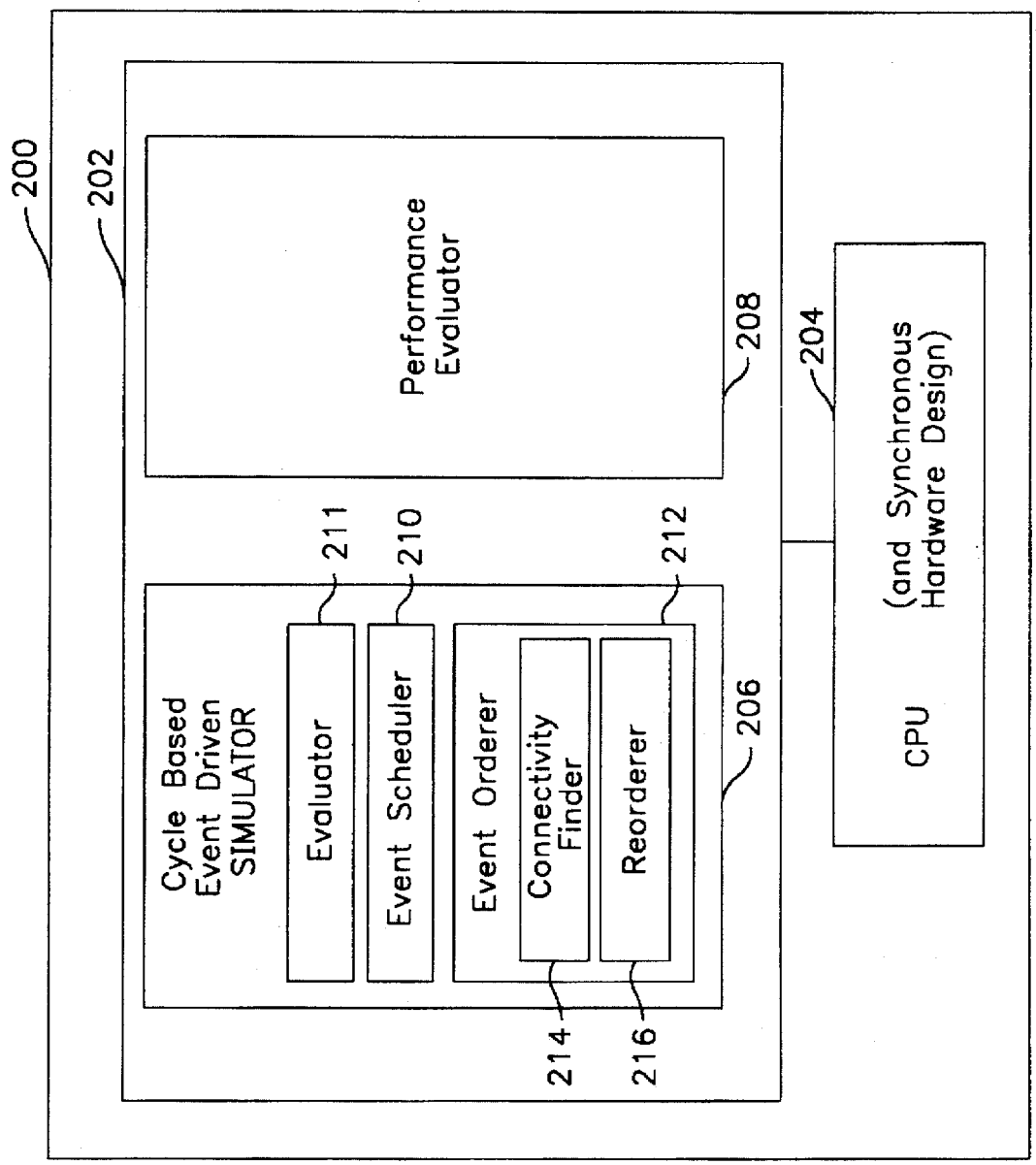
FIG. 2 illustrates a system block diagram running the cycle-based simulation technique and the measuring technique of the present invention.

FIG. 2 illustrates a system block diagram running the cycle-based simulation technique and the measuring technique of the present invention. Computer 200 with memory 202 and CPU 204 (synchronous hardware design) has cycle-based event-driven simulator 206 and performance evaluator 208. Cycle-based event-driven simulator 206 has event scheduler 210 and event orderer 212. Event orderer 212 has connectivity finder 214 for determining the dependencies and the connectivity between events occurring in a simulated hardware design, and reorderer 216 which reorders the events to produce an event evaluation list to be evaluated by evaluator 211. With the present invention, a user attempting to simulate a hardware design may first utilize performance evaluator 208 to evaluate the potential performance gain obtained by using cycle-based event-driven simulator 206 as opposed to other simulators. Upon receiving the results from performance evaluator 208, a user may make an informed decision as to what type of simulator would be the best choice for evaluating a given hardware design.

Figure 3:
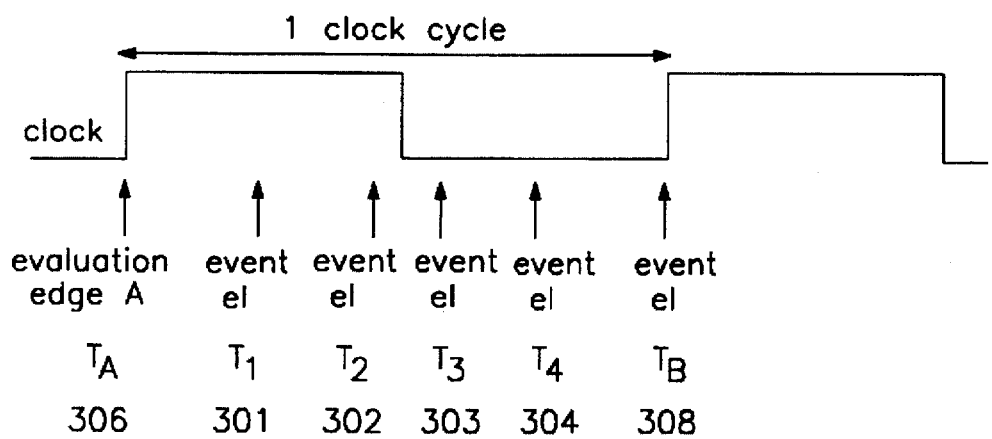
FIG. 3 illustrates a set of events in an exemplary clock cycle during the hardware design simulation performed by cycle-based event-driven simulator 206 referenced in FIG. 2.

FIG. 3 illustrates a set of events occurring during simulation of an exemplary hardware design as simulated by cycle-based event-driven simulator 206. All scheduled evaluations take place only at the active edge of the clock, e.g. at 306 and at 308. An event which is scheduled within a clock cycle is only evaluated at the next active edge of the clock. The exemplary events scheduled in clock cycle 300 include events 301, 302, 303 and 304. It is assumed that simulation is not being performed to verify timing and that timing verification would be performed separately by a static timing analyzer which is well known in the art. In the exemplary clock cycle illustrated in FIG. 3, the evaluation edges 306 and 308 are at a positive edge of the clock. Thus in this exemplary illustration, the positive edges of the clock are the active edges at which evaluation is performed. One clock cycle ranges from time $T_A$ to $T_B$. Only one active edge is included in each clock cycle.

Event scheduler 210 of cycle-based event-driven simulator 206 schedules events 301 through 304 to occur at time $T_1$ through $T_4$ respectively. With the use of the present invention, events 301 through 304 are scheduled to be evaluated at the next active edge, i.e. in this example at evaluation edge 308. All events are processed by event orderer 212 which checks whether it can eliminate certain unnecessary evaluations by ordering the events correctly. Event orderer 212 levelizes and orders evaluations such that each element is evaluated at most once per clock cycle.

The use of the present invention's cycle-based event-driven simulator provides for great advantages over prior art techniques. For one, the time wheel is sparse. In addition, all events are grouped together at the active edges of the clock for evaluation at clock cycles only. Thus, many unnecessary evaluations are eliminated by proper event ordering. All this results in a higher performance gain in the simulation of a given hardware design as compared to a simulation performed using other techniques.

Figure 4:
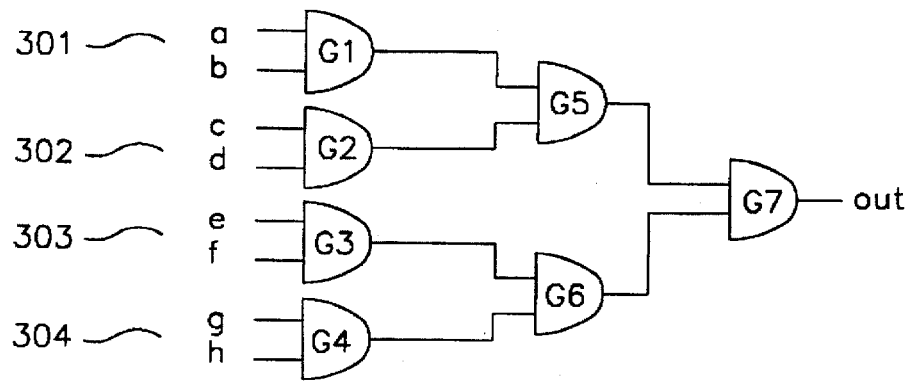
FIG. 4 illustrates an exemplary combinational circuit which may be evaluated by the cycle-based event-driven simulator of the present invention.

FIG. 4 illustrates an exemplary combinational circuit which may be evaluated by a given hardware design simulator. Assuming that there is no gate delay and cycle time is 20 nanoseconds (NS), inputs A, B, C, D, E, F, G and H change at times 2, 4, 6, 8, 10, 12, 14 and 16 respectively. When input A changes, gates G1, G5 and G7 are scheduled to be evaluated at time 2 when simulation is provided by a traditional event-driven simulator. Similar events are scheduled to be evaluated at times 4, 6, 8, 10, 12, 14 and 16. Therefore during one cycle, 24 gate evaluations take place using a traditional event-driven simulator on the given exemplary combinational circuit.

The present invention's cycle-based event-driven simulator 206 stores all input events (such as inputting of A through H into the illustrated combinational circuit) until the next clock edge, at which time cycle-based event-driven simulator 206 begins processing the events. The evaluation of each event occurring up until the next clock edge provides for evaluation of each gate at most once. Therefore in this example, instead of having to evaluate 24 gates, only 7 gates are evaluated using cycle-based event-driven simulator 206 saving 17 unnecessary evaluations for the simple circuit in a single cycle. Further, using cycle-based event-driven simulator 206 ensures that each element in the circuit is evaluated only at the active edges of the clock. In addition, each element is evaluated zero times if an element's input does not change.

Figure 5A:
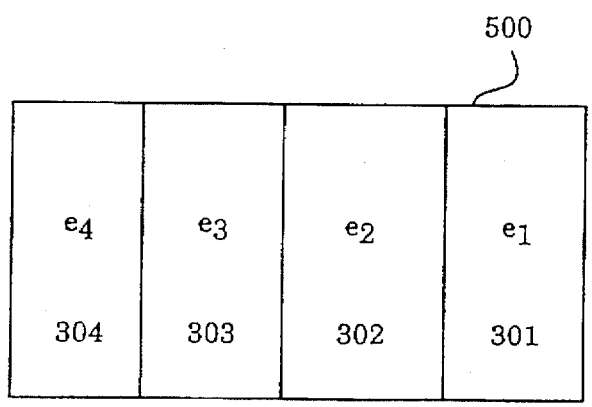
FIG. 5a illustrates an exemplary event queue 500 with events 301, 302, 303 and 304.

FIG. 5a illustrates an exemplary event queue 500 with events 301, 302, 303 and 304. Using the contents of event queue 500, the order of events including the events triggered by each of the events 301 through 304 are determined.

For example, FIG. 5b illustrates the order of events triggered by events 301 through 304. For event 301, where event 301 is an input of A into the combinational circuit illustrated in FIG. 4, event 301 triggers the processing of elements G1, G5, and G7. Event 302, for example, triggers the processing of elements G2, G5 and G7. Event 303 triggers the processing of elements G3, G6 and G7. Finally, event 304 triggers the processing of elements G4, G6 and G7. All four events lead to the processing of a single gate G7. Thus G7 may be evaluated a total of four times, resulting in three unnecessary evaluations. Events 301 and 302 lead to the evaluation at G5 two times, resulting in one unnecessary evaluation. Similarly, events 303 and 304 lead to two evaluations at G6, resulting in one unnecessary evaluation.

FIG. 5c illustrates a reordered list 500 of events. Event orderer 212 of cycle-based event-driven simulator 206 takes the lists illustrated in FIG. 5b, determines the connectivity of the events and reorders the lists according to the connectivity of the events in the lists. Event orderer 212 evaluates which gates are to be processed first, for example, the event orderer determines that G1 through G4 must be evaluated first. Next, G5 and G6 must be evaluated because they are dependent on the results produced by G1 through G4. Once G5 and G6 are evaluated, then G7 must be evaluated. Once the connectivity of the order of events are determined by event orderer 212, event orderer 212 builds up a final list placing all the events in their proper order of evaluation. This reordered list is then evaluated.

Figure 6A:
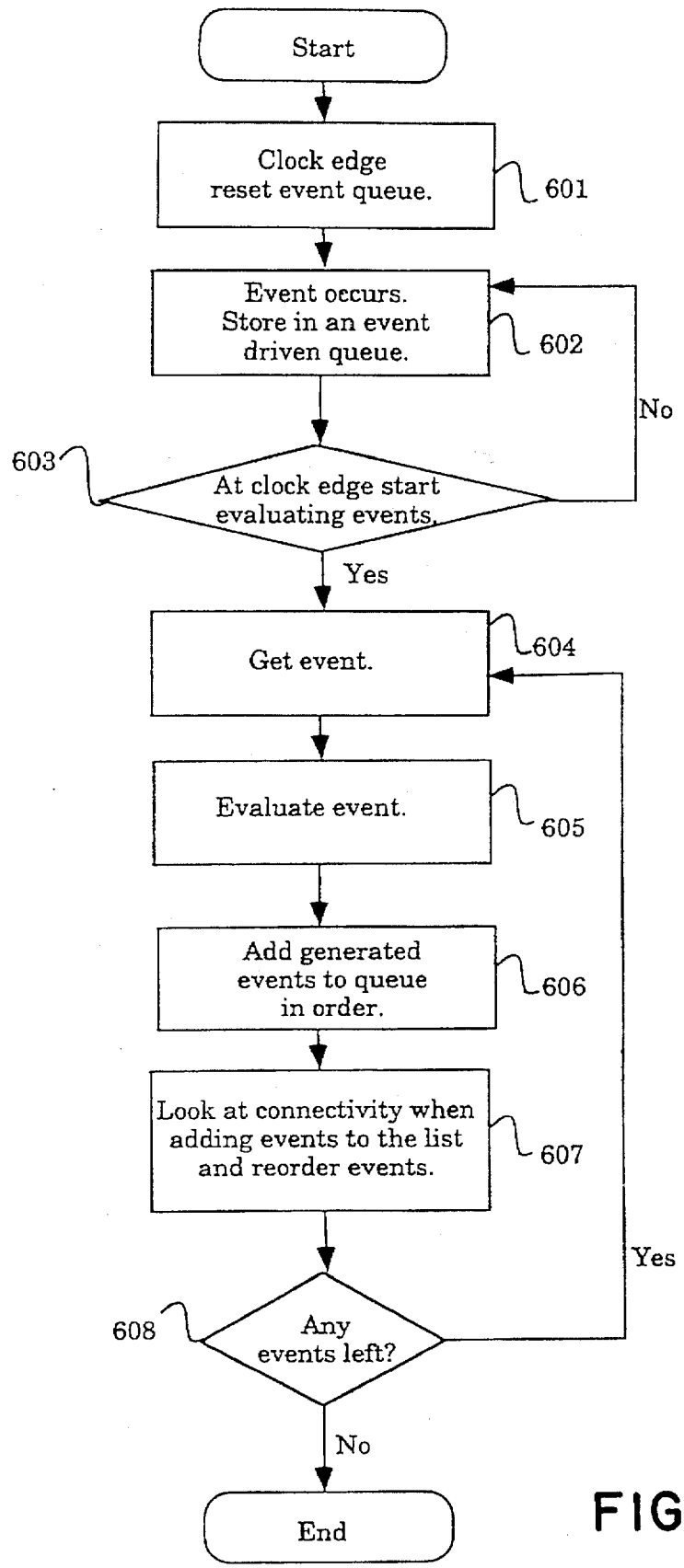
FIG. 6a is a flow chart illustrating the general steps followed by the cycle-based event-driven simulator of the present invention.

FIG. 6a is a flow chart illustrating the general steps followed by the cycle-based event-driven simulator of the present invention. In step 601, an active clock edge resets the event queue to empty. The event queue is now ready to receive new events up until the next clock edge. In step 602, an event occurs between the two clock edges, and are stored in the event queue. This is repeated each time the event occurs up until the next clock edge. In step 603, if a next evaluation clock edge has not been encountered, then cycle-based event-driven simulator 206 continues to store events in an event queue as they occur. Otherwise cycle-based event-driven simulator 206 begins evaluating the events in the queue. In step 604, cycle-based event-driven simulator 206 begins fetching an event from the queue.

In step 605, cycle-based event-driven simulator 206 evaluates the event fetched to test the hardware design being simulated. In step 606, any events generated as a consequence of the event being evaluated in step 605 are placed in the events queue in the order they are generated. In step 607, event orderer 212 looks at the connectivity of all the gates to be evaluated and determines dependencies between the respective events and the gates. The event orderer then reorders the events in the events queue to their proper order of evaluation as was exemplified in FIG. 5c. Finally in step 608, if there are any events left in the events queue, the process returns to step 604 and another event is fetched out of the events queue for processing.

Figure 6B:
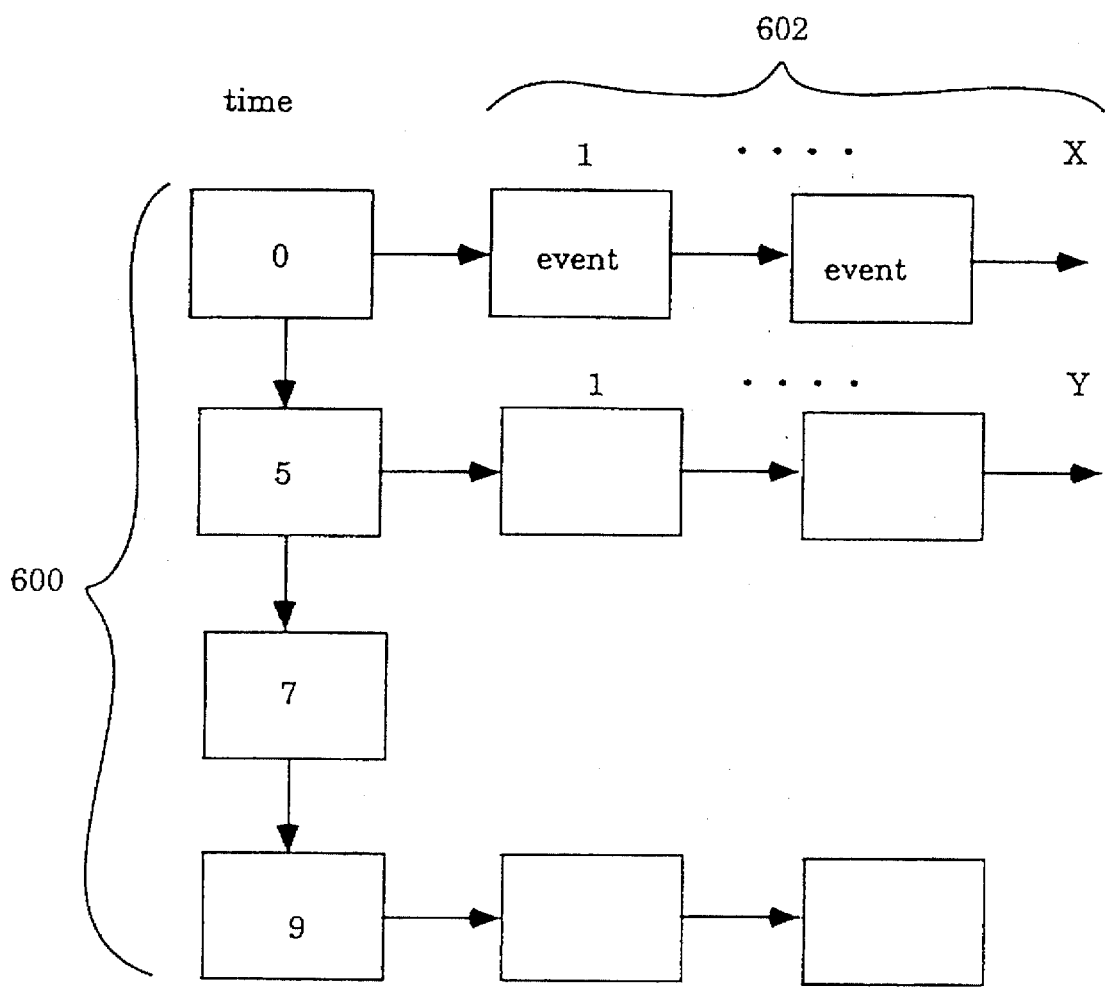
FIG. 6b illustrates a linked list of events as created by the cycle-based event-driven simulator of the present invention.

The selection of the scheduling technique is implementation specific. Traditional event simulators have used a standard scheduling technique called the time wheel technique. This time wheel technique which is well known in the art is one potential scheduling implementation which may be used with the present invention and is illustrated by the linked list 600 of clock cycles and the linked list 602 of events in FIG. 6b. In the Figure, for illustration purposes, events 1 through X are indicated as being evaluated at cycle 0 and events 1 through Y are indicated as being evaluated at cycle 5, and so on.

The use of time wheel technique for scheduling events is only used for illustration and other scheduling techniques may be used in the implementation of the present invention. The choice of scheduling techniques are many and would be implementation specific. It is therefore ultimately up to the designer of the cycle-based event-driven simulator. The method by which to create a scheduler for implementation with the present invention should be readily understood by a person skilled in the art given the method and apparatus of the present invention.

Given the method and apparatus of the present invention, a measuring technique such as performance evaluator 208 may be useful in aiding a user to determine the amount of performance gained by the use of the cycle-based event-driven simulator. The first determination which needs to be made by a user is to evaluate whether an oblivious simulation technique should be used over the event-driven simulation technique of the present invention. For example, given 100,000 gates, where 100 gates are being evaluated each cycle, it would be more desirable to use an event-driven technique which only evaluates those 100 gates per cycle. On the other hand, if 90,000 gates are being evaluated every cycle on an average out of the 100,000 gates available then it would be desirable to use the oblivious simulation techniques. In this example, an additional 10,000 gates would be evaluated using an oblivious simulation technique however, since 90,000 gates would be re-evaluated each clock cycle, the trade-off is acceptable.

Figure 7:
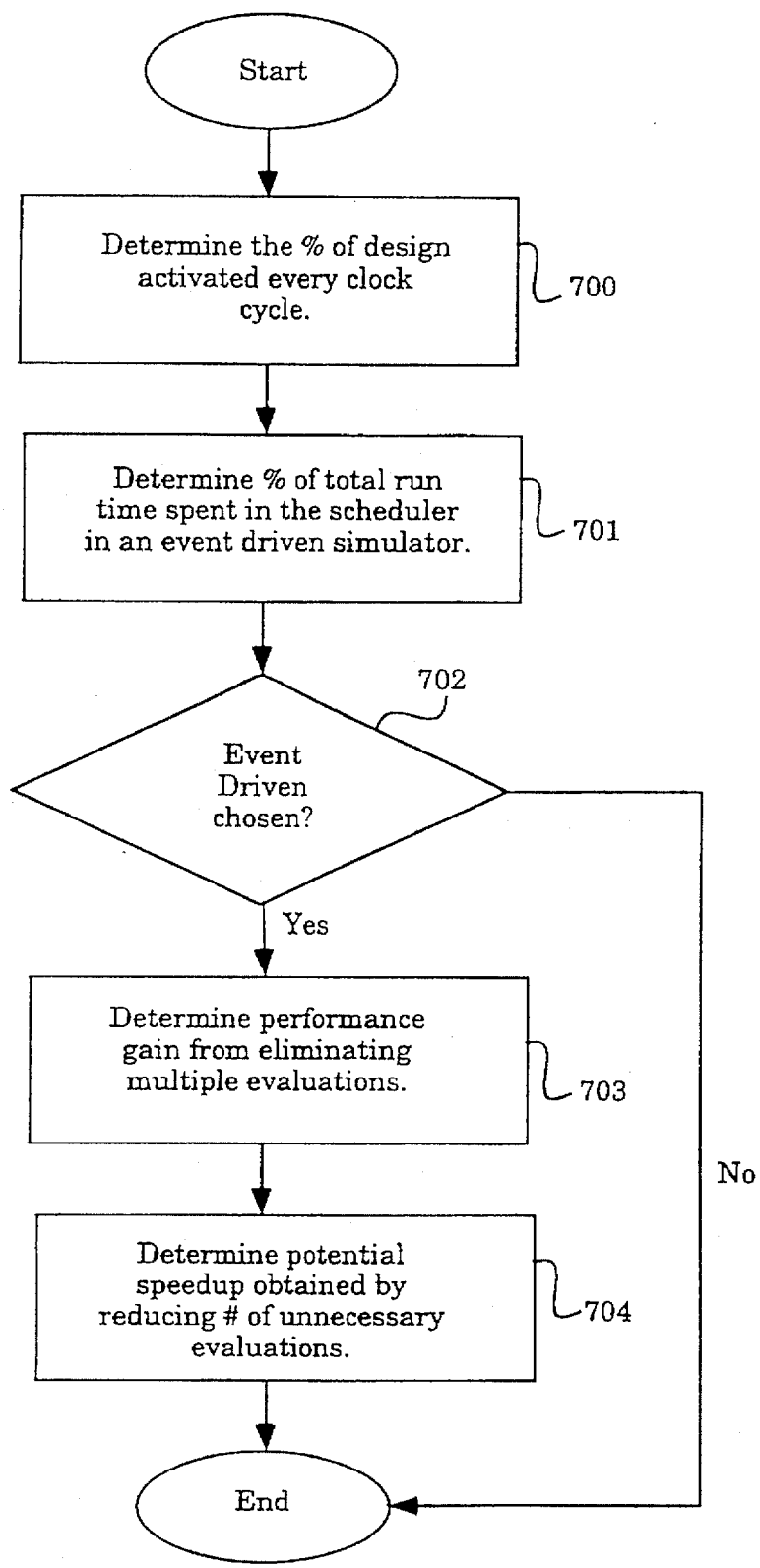
FIG. 7 is a flow chart illustrating the general steps followed by the performance evaluator of the present invention.

FIG. 7 is a flow chart illustrating the general steps followed by the performance evaluator of the present invention. First, in step 700, the average percentage of the design evaluated every clock cycle is determined. For any design, the primary input changes according to the stimulus vectors. Based on this, inputs change and certain parts of the design will need to be evaluated. The present invention estimates the average percentage that is evaluated every clock cycle. For example, in a typical compiled code simulator, a number of sub-routines are created for each module to evaluate the various elements. Given that each such sub-routine is a unit of evaluation, the number of sub-routines evaluated every clock cycle may be determined. Thus the percentage activity is the average number of sub-routines executed for a cycle divided by the total number of sub-routines in the design. A similar measurement may be determined for an interpreted simulator by calculating the percentage of elements activated. If the percentage activity is high, then an oblivious simulation approach should be chosen. Otherwise if the percentage activity is low, then an event-driven approach should be chosen.

In step 701, the percentage of total run time spent in the scheduler in an event-driven simulator is determined. This may be performed by profiling the schedule of routines. In determining whether to choose an oblivious simulation technique or an event-driven approach, it is not only important to determine the average percentage of the design evaluated at every clock cycle, but is also important to determine how much time is taken in by the scheduler during the simulation process. The advantage of using an oblivious simulation technique is that there is no scheduling necessary. The entire design is evaluated.

The percentage of scheduling overhead may be calculated by multiplying the time spent by the scheduler by 100 and dividing that result by the total time for simulation. If the scheduling overhead is high and the activity level is high, then an oblivious approach may be more desirable. If the scheduling overhead is low and the activity level is low, then an event-driven approach may yield a faster simulation. The determination of how high an overhead must be or how high an activity level must be before a given hardware design warrants the use of one simulator over another is primarily a judgment call which must be made by a user.

In step 702, if an event-driven technique is chosen based upon the results of steps 700 and 701, the performance gain obtained by eliminating multiple evaluations of an element during a clock cycle is determined in step 703. By levelizing and ordering the elements in the design, each element in the design should be evaluated at most once in each clock cycle. Levelization and ordering has some overhead which must be considered in the tradeoff. In the case of the typical compiled code simulator, it may be assumed that one sub-routine corresponds to one element in the design. Therefore, how many sub-routines are multiply evaluated per clock cycle is determined. In determining performance gain obtained from eliminating multiple evaluations for a compiled code simulation, it may be assumed for the sake of illustration that a module A has been compiled and the compilation produces four sub-routines for that module A. FIGS. 8 and 9 and the accompanying description illustrate the general steps followed by the performance evaluator in evaluating the number of potential excess evaluations which may occur using a hardware simulator without a cycle-based implementation.

FIG. 8 illustrates a table 800 showing data for four routines executed for module instance A if module A is run for three clock cycles. Module A is a hypothetical module with four routines, namely, sub-routines 1 through 4. The values in the table are extracted by running module A at least once to determine the number of times a sub-routine is executed in one clock cycle. In the table, sub-routine 1 would be executed two times in cycle 1, 0 times in cycle 2 and one time in cycle 3. Sub-routine 2 is executed three times in cycle 1, 0 times in cycle 2 and one time in cycle 3. Sub-routine 3 is evaluated 0 times in cycle 1, three times in cycle 2 and two times in cycle 3. Finally, sub-routine 4 is evaluated one time in cycle 1, three times in cycle 2 and two times in cycle 3. Thus the average routine evaluations for all cycles is 6 routine evaluations. These numbers are given solely for illustration purposes. Once these numbers are extracted from running module A, they are used in calculating the potential performance gain resulting from the use of the simulator of the present invention as illustrated in FIG. 9. The method by which the above numbers are extracted would be readily understood by a person skilled in the art.

In FIG. 9, the routines that were executed a certain number of times for each cycle is illustrated for module A in table 900. The values may be calculated from the values in the table of FIG. 8. The total number of sub-routines in module A is given as four. The average number of sub-routine evaluations per cycle is six routine evaluations as given in FIG. 8 and the average number of sub-routines evaluated zero times per cycle is given as one routine in FIG. 9. From these numbers, it can be determined that the average number of sub-routines evaluated at least once per clock cycle is the difference between the total number of sub-routines in module A and the average number of sub-routines evaluated zero times per cycle. Thus, for module A, the average number of sub-routines evaluated at least once per cycle is three. Therefore, without multiple evaluations, an average of three sub-routine evaluations should be performed per cycle. Since there are six sub-routine evaluations per cycle, there are some excess evaluations being performed.

The average number of excess evaluations per clock cycle may be calculated by taking the difference between the average number of sub-routine evaluations per cycle and the average number of sub-routines evaluated at least once per clock cycle. Thus for module A, the result is three excess evaluations per clock cycle. The percentage of excess evaluations may be calculated by taking the average number of excess evaluations per clock cycle times one hundred divided by the average number of sub-routines evaluated at least once per clock cycle. This is an excess with respect to an ideal cycle simulator where everything is evaluated at most once. For example, the percentage of excess evaluation for module A may be calculated as three times one hundred divided by three producing 100%. Thus for our exemplary simulation, many excess evaluations are being made.

Back in FIG. 7, in step 704, the potential speed-up obtained by reducing the number of unnecessary multiple evaluations is determined. It is assumed here that all elements in the design (e.g. gates) are equivalent in terms of execution time. In the case of our exemplary compiled code simulator module A, it is assumed that each sub-routine takes the same amount of CPU time. Although this assumption is not totally accurate, it allows the estimation of the potential speed-up which may be obtained by reducing the number of unnecessary evaluations. The speed-up factor may be calculated by taking the average number of sub-routine evaluations per cycle divided by the average number of sub-routines evaluated at least once per clock cycle. In the exemplary module A, the speed-up factor is two. The speed-up factor gives an approximate number to quantify the simulation speed-up which may be obtained by applying the levelization and ordering technique of the present invention.

What has been described is a method and apparatus for cycle-based event-driven simulation of hardware designs. The use of a cycle-based event-driven simulation technique may provide a performance gain by evaluating events only in cycles i.e. at evaluation edges of the clock and by eliminating multiple unnecessary evaluations of elements of a design.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed:

1. A method for simulating a hardware design for testing on an apparatus comprising a processor and a memory, said method comprising the steps of:

determining a potential performance gain by using a cycle-based event-driven simulator to simulate the hardware design;

ordering events occurring in an evaluation clock cycle in said hardware design being simulated by adding said occurring events in the order that they are generated to an event queue, while finding dependencies and connectivity between said events to evaluate each element in said hardware design at most once per clock cycle; and reordering the events to produce an event evaluating list simulating said hardware design based on the determining and ordering steps by evaluating all of said events from said event evalution list at the end of said evaluation clock cycle.

2. The method of claim 1 further comprising the step of resetting an event queue at each clock edge after each said event has been evaluated.

3. The method of claim 2 further comprising the step of storing each said event in said event queue as they occur in said hardware design being simulated.

4. The method of claim 3 further comprising the step of evaluating said event fetched from said event queue.

5. The method of claim 1 wherein said step of evaluating further comprises the step of fetching an event in said event queue.

6. The method of claim 5 further comprising the step of fetching the next event in said queue if there are more events left in said event queue.

7. An apparatus including a processor and a memory, for providing a cycle-based event-driven simulator for simulating a given hardware design, said apparatus comprising:

an event performance evaluator for evaluating a potential performance gain by using the cycle-based event-driven simulator to simulate the hardware design;

an event orderer for ordering events occurring while said hardware design is running in simulation by adding said occurring events in the order that they are generated to an event queue while finding dependencies and connectivity between said events to evaluate each element in said hardware design at most once per clock cycle and reordering the events to produce an event evaluation list; and an evaluator for evaluating said events from said event evaluation list occurring in an evaluation clock cycle to simulate said hardware design.

8. The apparatus of claim 7 wherein said event orderer further comprises a connectivity finder for finding dependencies and connectivity between said events in said event queue.

9. The apparatus of claim 7 wherein said event orderer further comprises a reorderer for reordering said events in said event queue, and evaluating said events in said event queue.

10. A system including a processor and a memory, for providing a cycle-based event-driven simulator for simulating a given hardware design, said system comprising:

an event performance evaluator for evaluating a potential performance gain by using the cycle-based event-driven simulator to simulate the hardware design;

an event orderer for ordering events occurring while said hardware design is running in simulation by adding said occurring events in the order that they are generated to an event queue;

a connectivity finder coupled to the event orderer for finding dependencies and connectivity between said events to evaluate each element in said hardware design at most once per clock cycle; and an event scheduler for scheduling said events to be evaluated to simulate said hardware design.

11. The system of claim 10 wherein said event orderer further comprises a reorderer for reordering said events in said event queue, and evaluating said events in said event queue.

12. A method for evaluating a performance gain for using a cycle-based event-driven simulator to simulate a hardware design, said method comprising the steps of:

determining a percentage of said hardware design activated every clock cycle when said hardware design is running;

determining a percentage of total run time spent in a scheduler of said cycle-based event-driven simulator;

determining, based on the percentage of said hardware design activated every clock cycle and the percentage of total run time spent in the scheduler, whether a cycle-based event-driven simulator should be used for simulating a given hardware design;

determining a performance gain achieved by using a cycle-based event driven simulator to simulate said hardware design;

determining a performance gain from eliminating multiple evaluations at each element of said hardware design; determining a potential speedup obtained by reducing the number of unnecessary evaluations at each gate in said hardware design; and evaluating the performance gain for using the cycle-based event-driven simulator based on the results of the determining steps.

* * * * *

UNITED STATES PATENT AND TRADEMARK OFFICE
CERTIFICATE OF CORRECTION

PATENT NO.    : 5,696,942
DATED         : December 9, 1997
INVENTOR(S)   : Palnitkar et al.

It is certified that error appears in the above-identified patent and that said Letters Patent is hereby corrected as shown below:

Column 8,
Lines 64-66, please delete "in said hardware design at most once per clock cycle; and reordering the events to produce an event evaluation list simulating said hardward design based on the" and insert -- in said hardware design at most once per clock cycle and reordering the events to produce an event evaluation list;
      simulating said hardware design based on the --.

Signed and Sealed this

Third Day of September, 2002

Attest:

JAMES E. ROGAN
Attesting Officer    Director of the United States Patent and Trademark Office